(12) United States Patent
Shen

(10) Patent No.: US 6,194,302 B1
(45) Date of Patent: Feb. 27, 2001

(54) INTEGRATED PROCESS FLOW TO IMPROVE THE ELECTRICAL ISOLATION WITHIN SELF ALIGNED CONTACT STRUCTURE

(75) Inventor: Yun-Hung Shen, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/408,495

(22) Filed: Sep. 30, 1999

(51) Int. Cl.$^7$ ............... H01L 21/336; H01L 21/3205; H01L 21/4763
(52) U.S. Cl. ............... 438/597; 438/303; 438/585; 438/586; 438/587; 438/592; 438/595; 438/634
(58) Field of Search ............... 438/303, 453, 438/523, 533, 585–589, 592, 595, 597–598, 634

(56) References Cited

U.S. PATENT DOCUMENTS

| | | | |
|---|---|---|---|
| 4,912,061 | 3/1990 | Nasr | 437/44 |
| 5,208,472 | 5/1993 | Su et al. | 257/344 |
| 5,651,857 | 7/1997 | Cronin et al. | 156/644.1 |
| 5,663,586 | 9/1997 | Lin | 257/336 |
| 5,879,993 | 3/1999 | Chien et al. | 438/266 |
| 5,923,986 | 7/1999 | Shen | 438/303 |
| 6,033,981 | * 3/2000 | Lee et al. | 438/624 |

* cited by examiner

Primary Examiner—John F. Niebling
Assistant Examiner—Ha Tran Nguyen
(74) Attorney, Agent, or Firm—George O. Saile; Stephen B. Ackerman; William J. Stoffel

(57) ABSTRACT

A method of fabrication of a top half spacer on a first spacer on a gate structure for a self aligned contact (SAC) process. The method begins by providing at least two spaced gate structures having first spacers on a substrate. Next, we form a first insulating layer over the substrate. Then we form a first dielectric layer over the surface. The first dielectric layer is etched back to form an top spacer on the sidewalls of the first spacer. A second insulating layer is formed over the first insulating layer, the top spacer and the gate structures. A photoresist layer is formed over the second insulating layer. The photoresist layer having a contact photoresist opening over the top spacers and first spacers. The first and second insulating layers are etched using the first and the top spacers as etch masks to form a self aligned contact (SAC) opening. Lastly, a self aligned contact (SAC) is formed filling the self aligned contact (SAC) opening. The top spacers acts as an etch buffer during the SAC opening etch to protect the gate structure from shorting to the contact plug.

13 Claims, 3 Drawing Sheets

INTEGRATED PROCESS FLOW TO IMPROVE THE ELECTRICAL ISOLATION WITHIN SELF ALIGNED CONTACT STRUCTURE

BACKGROUND OF INVENTION

1) Field of the Invention

This invention relates generally to fabrication of semiconductor devices and more particularly to the formation of spacers on gate structures for self aligned contact (SAC) structures for CMOS semiconductor devices.

2) Description of the Prior Art

The self aligned contact (SAC) is a powerful method used in semiconductor manufacturing to reduce chip size by shortening the separation of contact to polysilicon. This is especially true in memory products. The space used for lightly doped drain (LDD) limits the smallest size possible with SAC. Creation of a double spacer helps alleviate the conflict between LDD and SAC requirements.

U.S. Pat. No. 5,923,986(Shen) (same inventor as present invention) shows a method for a double spacer (1 full and 1 partial top spacer) for a Self aligned silicide (SALICIDE) process. This process differs from the process of the present invention that is directed to a distinctly different process/structure—a self aligned contact (SAC).

In U.S. Pat. No. 5,208,472 (Su et al.) a method of forming a SAC structure is described where a first side wall is used to define a LDD structure, and a second side wall is used to extend the oxide region at the gate edge and improve source/drain leakage property.

In U.S. Pat. No. 4,912,061 (Nasr) a method is described for fabricating a self aligned metal oxide semiconductor device using a disposable silicon nitride spacer.

U.S. Pat. No. 5,651,857(Cronin et al.) shows a top half spacer.

U.S. Pat. No. 5,879,993(Chien et al.) shows a double spacer (1 full and 1 half bottom spacer) for a contact structure.

U.S. Pat. No. 5,663,586(Lin) shows a double spacers process.

The use of spacers are important in forming SAC structures and protecting LDD near a gate which can lead to higher densities and smaller chips; however, there is a limit to which the density can be increased, particularly when the LDD and SAC requirements are in conflict. It is, therefore, the purpose of this invention to teach a means by which spacers can be used without the conflicting requirements of the lightly doped drain and the self aligned contact. It is also a purpose of the invention to teach a means that the gate structure can be protected by a top spacer etch buffer so that the SAC opening etch will not create shorts to the gate structure.

SUMMARY OF THE INVENTION

It is an object of the present invention to provide a method for fabricating a wide top spacer for a self aligned contact (SAC) process that prevents the top corner of spacers during the contact opening etch.

It is an object of the present invention to provide a "one and a half" spacer process to form a "wide top spacer" that acts as an etch buffer to protect the top of the first spacer during a self aligned contact (SAC) opening etch.

The invention provides a method of fabrication of spacers on a gate structure for a self aligned contact (SAC) process. The method begins by providing at least two spaced gate structures on a substrate. The gate structures having a top and sidewalls. We form first spacers on the sidewalls of the gate structures. The first spacers have sidewalls. Next, we form a first insulating layer over the substrate. The sidewalls of the first spacer having a upper area above the level of the first insulating layer. Then we form a first dielectric layer over the gate structures, the first spacer and the first insulating layer. The first dielectric layer is etched back to form an top spacer on the sidewalls of the first spacer. The first spacer and the top spacer comprise a wide top spacer. We form a second insulating layer over the first insulating layer, the top spacer and the gate structures. We form a photoresist layer over the second insulating layer. The photoresist layer having a contact photoresist opening over the top spacers and first spacers. We etch the first and second insulating layers using the first and the second spacers as etch masks to form a self aligned contact (SAC) opening. Lastly, a self aligned contact (SAC) is formed filling the self aligned contact (SAC) opening.

The method uses spacers formed from two dielectric layers on the edge of the gate structure. The second spacer (top spacer) is formed on the upper shoulder of the first spacer. The top spacer functions as an etch buffer to protect the first spacer and gate structure from overetching during the etching of the SAC opening.

Another important feature of the invention is the gate cap layer and the top spacer 30. This gate cap layer 20 along with the top spacer prevents the SAC opening etch from harming the conductive layer 16 of the gate structure. The top spacer 30 must have a high etch selectivity with respect to the second insulating layer 38. Therefore the top spacer is composed of silicon nitride (SiN), not oxide or Silicon oxynitride.

This invention allows narrower spacers for the SAC area and a wider top spacer for the SAC opening Etch. The SAC contact area is not limited by the prior art's full length double spacers. The SAC contact can be shrunk without impacting the transistor and the technique is easily applied to either SRAM's or DRAM's or other devices.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a cross sectional view of a gate structure with first spacers.

FIG. 2 shows the first insulating layer formed over the surface.

FIG. 3 shows the first dielectric layer 28 is formed over the first insulating layer.

FIG. 4 shows the etching of the first dielectric layer 28 to form top spacers 30.

FIG. 5 shows the deposition of the second insulating layer 38.

FIG. 6 shows the SAC opening 44 etch. The top spacer 30 and the top cap layer 20 act as etch buffers to prevent the etch from harming the conductive layer.

FIG. 7 shows the formation of the self aligned contact (SAC) 50.

DETAILED DESCRIPTION OF THE PREFERRED EMBODIMENTS

Figure 1:
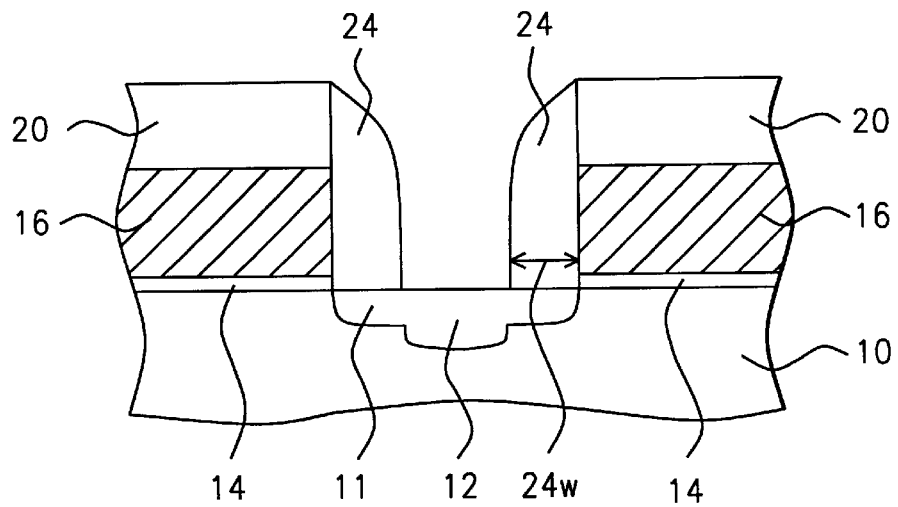
FIGS. 1, 2, 3, 4, 5, 6 and 7 are cross sectional views for illustrating a method for manufacturing a top spacer for a self aligned contact (SAC) process according to the present invention.

The present invention will be described in detail with reference to the accompanying drawings. The present invention relates to techniques for forming self-aligned semiconductor devices and components for integrated circuits. More particularly, the invention relates to a method of forming a self-aligned contact for a metal oxide semiconductor field effect transistor (MOSFET) having a low percentage of shorting between the gate and the contact plug 50.

The method uses a full length first spacer 24 and a "half" or partial length top spacer 30 formed on the top sidewalls of the first spacer 24. The top spacer functions as an etch buffer to protect the first spacer and gate structure from overetching during the etching of the SAC opening. Also, another important feature of the inventions is the SiN cap layer 20 that further acts as an etch buffer.

In the following description numerous specific details are set forth such as flow rates, pressure settings, thicknesses, etc., in order to provide a more thorough understanding of the present invention. It will be obvious, however, to one skilled in the art that the present invention may be practiced without these details. Also, the term "about" means plus or minus ten percent (+/−10%).

A substrate 10 is understood to possibly comprise a semiconductor wafer, active and passive devices formed within the wafer and layers formed above the wafer surface. The term "substrate" is mean to include devices formed within a semiconductor wafer and the layers overlying the wafer.

Referring to FIG. 1, at least two spaced gate structures 14 16 20 are provide over a substrate 10. The gate structures 14 16 18 having a top and sidewalls.

The gate structure preferably comprises a gate dielectric (e.g., oxide) layer 14, a conductive layer 16 and a top cap layer 20. The gate structure preferably has a overall thickness of between about 3000 and 5000 Å. The gate oxide layer 14 preferably has a thickness in a range of between about 50 and 60 Å and an overlying conductive layer 16 having a thickness in a range of between about 1500 and 2500 Å. Other configurations of the gate structure are possible, such as where the conductive layer is formed of more than one conductive layers. The conductive layer is preferably a two layer structure of a lower polysilicon layer with a thickness between 1900 and 2100 Å and a overlying Tungsten silicide (WSi$_x$) layer with a thickness between 1900 and 2100 Å.

The gate cap layer 20 is preferably composed of silicon nitride preferably having a thickness of between about 1900 and 2100 Å.

At this point LDD regions 11 (lightly doped source and drains) can be formed by an implant process adjacent to the gate structure.

FIG. 1 shows a first spacer 24 formed on the sidewalls of the gate structures 14 16 20. The first spacer 24 has sidewalls. The first spacer is made by forming a dielectric layer over the surface and anisotropically etching the dielectric layer. The dielectric layer (not shown) and first spacer are preferably composed of: silicon nitride (SiN). The dielectric layer and first spacer preferably has a thickness of between about 600 and 800 Å.

At this point, source and drains 12 can be formed adjacent to the first spacers in the substrate. The S/D regions 12 can be formed by an implant process using the spacers as a implant mask.

Figure 2:
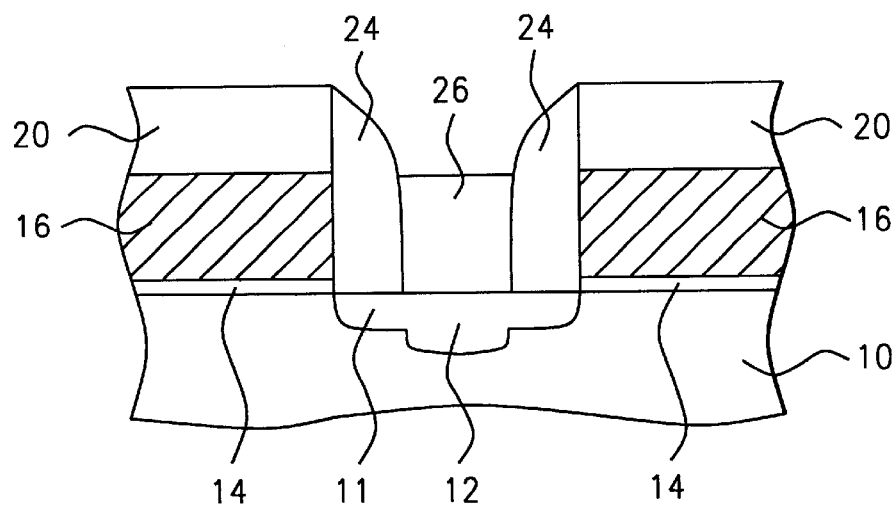

As shown in FIG. 2, a first insulating layer 26 is formed over the substrate. The sidewalls of the first spacer 24 having a upper area above the first insulating layer. The first insulating layer is preferably composed of borophosphosilicate glass (BPSG), borophosphosilicate glass (BPSG) formed using Tetraethylorthosilicate (BPTEOS); phosphosilicate glass (PSG), oxide, or doped oxides and is most preferably composed of BPTEOS. The first insulating layer preferably has a thickness of between about 1500 and 2500 Å and most preferably between 1900 and 2100 Å.

Figure 3:
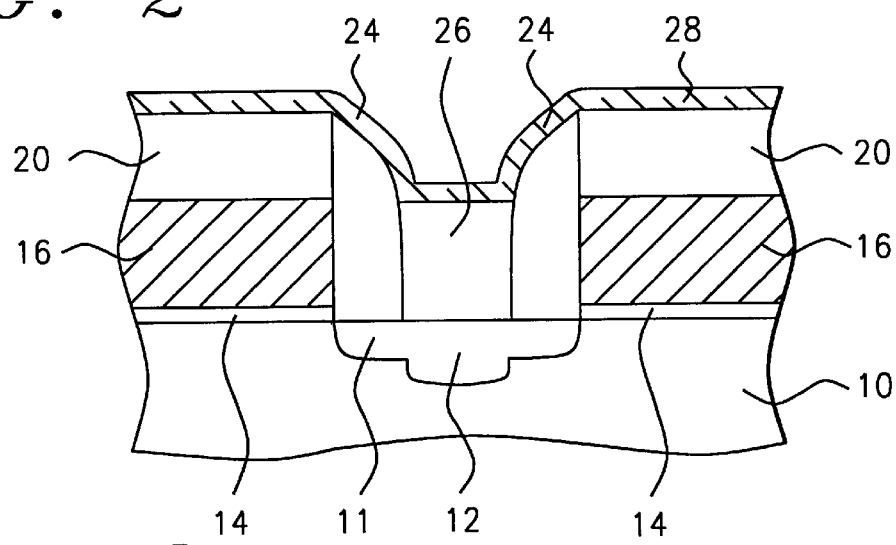

As shown in FIG. 3, we next form a first dielectric layer 28 over the gate structures 14 18, the first spacer 24 and the first insulating layer 26. The first dielectric layer is preferably composed of: LPSiN (low pressure chemical vapor deposition (e.g., LPCVD SiN)) or PE-SiN (SiN formed by PECVD) or SiN and is most preferably composed of LP-SiN. The first dielectric layer preferably has a thickness of between about 200 and 400 Å.

Figure 4:
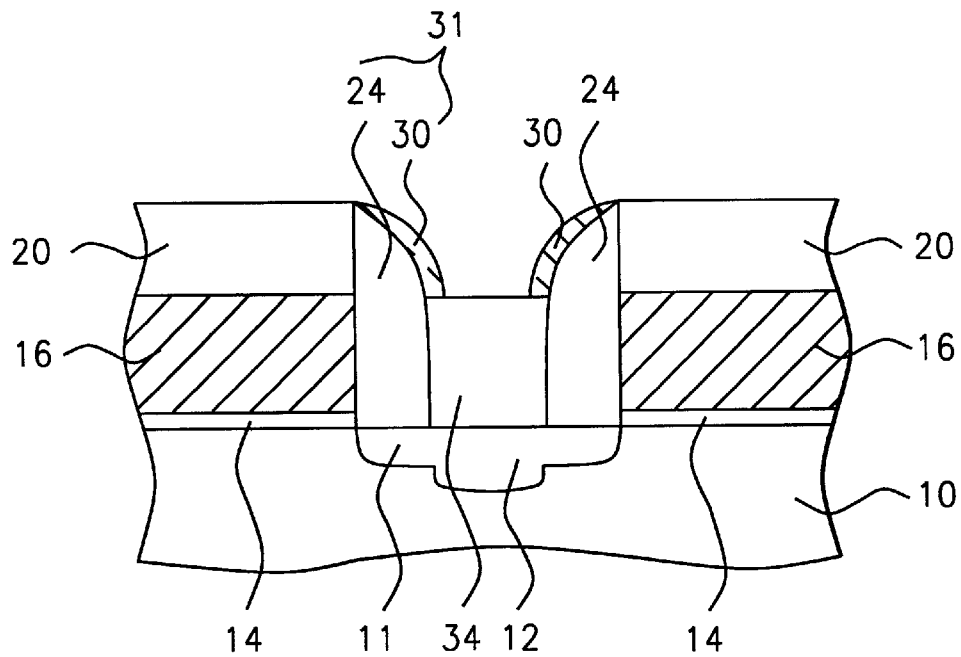

Referring to FIG. 4, we etch back the first dielectric layer 28 to form an top spacer 30 on the sidewalls of the first spacer 24. The top spacer 30 has a top and a bottom. The (a) first spacer 24 and (b) the top spacer 30 comprise a "wide top spacer" 31. The top spacer 30 has a height between 1900 and 2100 and a width between 200 and 400 Å. The first spacer is preferably composed of: LPSiN (low pressure chemical vapor deposition (e.g., LPCVD SiN)) or PE-SiN (SiN formed by PECVD) or SiN and is most preferably composed of LP-SiN.

Figure 5:
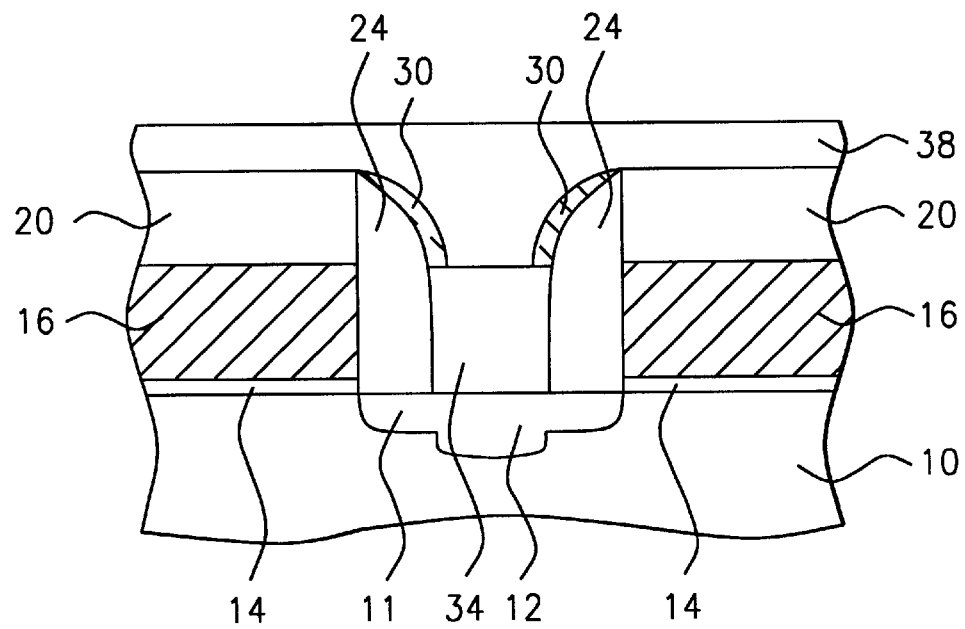

As shown in FIG. 5, we form a second insulating layer 38 over the first insulating layer 34, the top spacer 30 and the gate structures 14 16 20. The second insulating layer can be composed of: oxide, doped oxide, BPTEOS, BPSG, PSG and is most preferably composed of BPTEOS.

Figure 6:
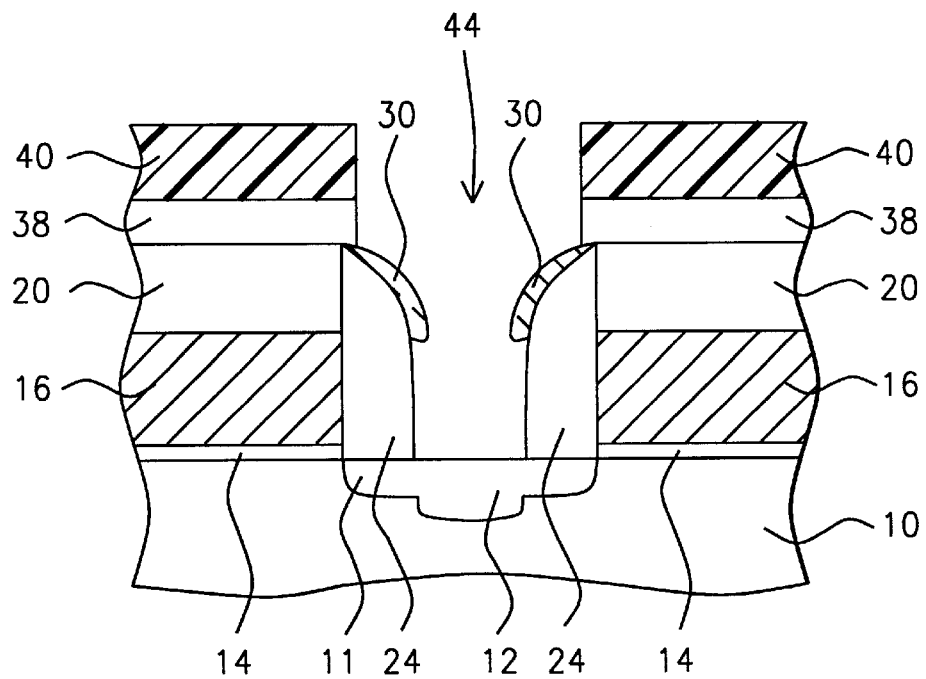

Referring to FIG. 6, next a photoresist layer 40 is formed over the second insulating layer 38. The photoresist layer has a "contact photoresist opening" over the top spacers 30 and first spacers 24. The contact photoresist opening is used to define the self aligned contact (SAC).

Next, using the photoresist layer, first and the second spacers as etch masks; we etch the first and second insulating layers 34 38 to form a self aligned contact (SAC) opening 44. The first and second insulating layers 34 38 are preferably etched using a dry RIE etch with the following conditions/reactants: pressure between 35 and 55 milli-torr, a power between 1200 W and 1400 W, a C4F8 flow between 10 and 14 sccm, a CO flow between 18 and 200 SCCM, a Ar flow between 340 and 370 sccm (e.g., 45Mt/1300 W/12 C4F8/190Co/360Ar) and preferably a first or second insulating layer (e.g., BPTEOS) to SiN etch selectivity between 15:1 and 25:1. The flow ratios (e.g., mole ratios) of the gases can be scaled up or down depending on the reactor size, only the relative concentrations (molar concentrations) must be maintained.

During the SAC etch, some of the top spacer 30 is etched away. Between 250 and 350 Å of the top spacer are typically etched away. Without the invention's top spacer, the SAC etch could expose portions of the gate structure and more particularly the conductive layer. If the conductive layer is too thin (e.g., <200 Å), it cause the poly −1 to plug breakdown to and caused a device failure. The top spacers are critical. The top spacers act as etch buffers to protect the top corners of the spacers. Also, the invention "top wide spacers" 24 30 (31) have a distinct advantages over the prior art's full length double spacers. The invention's top spacer allows the maximum width contact plug 50 to be formed between the first spacers 24. In contrast, the prior art's double spacers reduce the contact area and make contact gap-filling more difficult.

Figure 7:
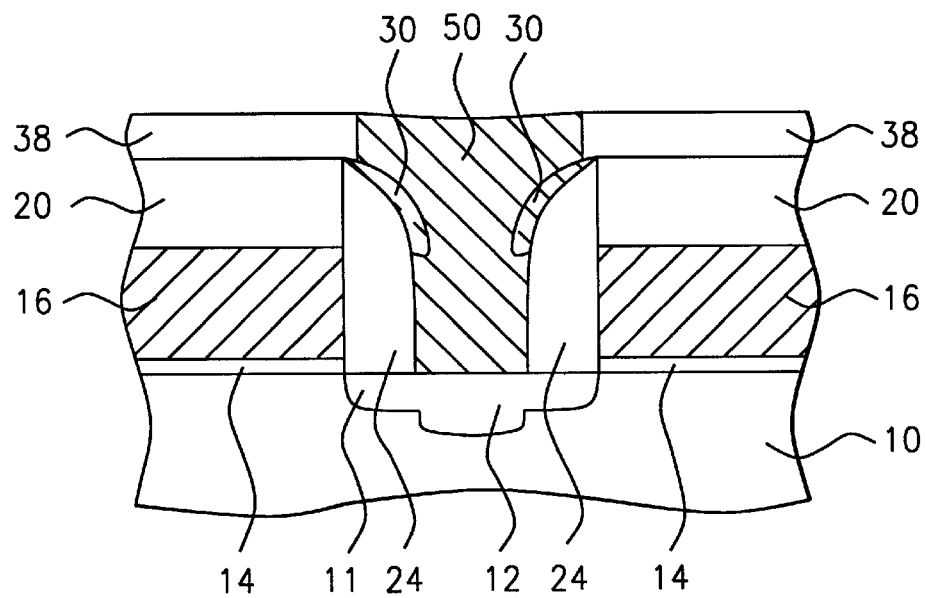

Referring to FIG. 7, a self aligned contact (SAC) (plug) 50 is formed filling the self aligned contact (SAC) opening 44. The self aligned contact (SAC) is a conductive material that electrically contact the substrate or a doped region within the substrate. The self aligned contact (SAC) or contact plug can be formed of a Barrier layer and a conductive layer. The barrier layer can be made of TiN having a thickness of between about 225 and 275 Å. The conductive layer can be formed of Polysilicon, W or $WSi_x$. The most preferred self aligned contact (SAC) 50 is composed of doped polysilicon. Difference From Prior Art (U.S. Pat. No. 5,923,986(Shen)—Assigned to Same Assignee—TSMC)

In contrast to the inventor's previous patent (U.S. Pat. No. 5,923,986(Shen)—attorney docket TSMC 97–479) it is important to note that the top spacer of the invention is not used in a SALICIDE process (e.g., a Self aligned silicide process). The top spacer in the present invention is an etch buffer for the SAC etch. Also, the etch selectivity of top spacer 30 to the second insulating layer 38 is critical. Top spacer 30 can only be formed of SiN, not oxide or Silicon oxynitride (SiON). The etch process is also very critical to obtain the required etch selectivity.

In contrast, the spacers in U.S. Pat. No. 5,923,986(Shen) are used a "roofs" to prevent the formation of a Salicide bridge on the spacers. In U.S. Pat. No. 5,923,986, the top spacer servers as a roof so top spacer can be formed of an oxide.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art. Also, in the specification and claims, the term "about" means a tolerance of plus or minus 10 percent.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of spacers on a gate structure for a self aligned contact (SAC) process; comprising the steps of:
    a) forming a plurality of spaced gate structures on a substrate; said gate structures having a top and sidewalls;
    b) forming first spacers on said sidewalls of said gate structures; said first spacers having sidewalls;
    c) forming a first insulating layer over said substrate; said sidewalls of said first spacers having a upper area above said first insulating layer;
    d) forming a dielectric layer over said gate structures, said first spacers and said first insulating layer;
    e) etching back said dielectric layer to form top spacers on said sidewalls of said first spacers; said top spacers having a top and a bottom; said first spacers and said top spacers form combined top spacers;
    f) forming a second insulating layer over said first insulating layer, said top spacers and said gate structures;
    g) forming a photoresist layer over said second insulating layer, said photoresist layer having a opening over said top spacers and first spacers; etching said first and second insulating layers using said photoresist layer and said top spacers as etch masks to form self aligned contact (SAC) openings;
    h) forming self aligned contacts (SAC) by filling said self aligned contact (SAC) openings with a conductive material.

2. The method of claim 1 wherein said gate structure comprises a gate oxide layer, a conductive layer and a top cap layer; said gate oxide layer having a thickness in a range of between about 50 and 60 Å and an overlying conductive layer comprised of a polysilicon layer and a tungsten silicide layer; said gate cap layer composed of silicon nitride; said gate structure having a thickness in a range of between about 3000 and 5000 Å.

3. The method of claim 1 wherein the step of, forming said first spacers comprises the steps of:
    a) depositing a layer of silicon nitride over said gates structures and said substrate by low pressure chemical vapor deposition to a thickness of between about 600 and 800 Angstroms,
    b) anisotropically etching said silicon nitride to form said first spacers.

4. The method of claim 1 wherein said first spacers and said top spacers are composed of silicon nitride and said first insulating layer is composed of BPSG formed using Tetraethylorthosilicate.

5. The method of claim 1 wherein said first spacers and said top spacers are composed of silicon nitride.

6. The method of claim 1 wherein said top spacers has a width in a range of between about 200 and 400 Å and said top spacers having a height in a range of between about 1900 and 2100 Å.

7. The method of claim 1 wherein said first insulating layer having a thickness in a range of between about 1500 and 2500 Å and said first insulating layer composed of a material selected from the group consisting of BPSG; BPTEOS, phosphosilicate glass (PSG), low k-material, and silicon oxide.

8. A method of fabrication of spacers on a gate structure for a self aligned contact (SAC) process; comprising the steps of:
    a) forming a plurality of spaced gate structures on a substrate; said gate structures having a top and sidewalls;
    b) forming first spacers on said sidewalls of said gate structures; said first spacers having sidewalls; said first spacers composed of Silicon nitride having a width of between about 600 and 800 Å;
    c) forming a first insulating layer over said substrate; said sidewalls of said first spacers having a upper area above said first insulating layer; said first insulating layer composed of BPTEOS;
    d) forming a dielectric layer over said gate structures, said first spacers and said first insulating layer; said dielectric layer having a thickness of between about 200 and 400 Å;

e) etching back said dielectric layer to form top spacers on said sidewalls of said first spacers; said top spacers having a top and a bottom; said first spacers and said top spacers formed combined top spacers; said top spacers composed of silicon nitride;

f) forming a second insulating layer over said first insulating layer, said top spacer and said gate structures; said second insulating layer composed of BPTEOS;

g) forming a photoresist layer over said second insulating layer said photoresist layer having a opening over said top spacers and first spacers; etching said first and second insulating layers using said photoresist layer and said second spacers as etch masks to form self aligned contact (SAC) openings;

h) forming self aligned contacts (SAC) by filling said self aligned contact (SAC) openings with a conductive material.

9. The method of claim 8 wherein said gate structure comprises a gate oxide layer, a conductive layer and a top cap layer; said gate oxide layer having a thickness in a range of between about 50 and 60 Å and an overlying conductive layer comprised of a polysilicon layer and a Tungsten silicide layer; said gate cap layer composed of silicon nitride; said gate structure having a thickness in a range of between about 3000 and 5000 Å.

10. The method of claim 8 wherein the step of: forming said first spacers comprises the steps of:

a) depositing a layer of silicon nitride over said gates structures and said substrate by low pressure chemical vapor deposition to a thickness of between about 600 and 800 Angstroms, b) anisotropically etching said silicon nitride to form said first spacers.

11. The method of claim 8 wherein said first spacers and said top spacers are composed of silicon nitride and said first insulating layer is composed of BPSG formed using Tetra-ethylorthosilicate.

12. The method of claim 8 wherein said top spacers has a width in a range of between about 200 and 400 Å and said top spacers having a height in a range of between about 1900 and 2100 Å.

13. The method of claim 8 wherein said first insulating layer having a thickness in a range of between about 1500 and 2500 Å.

* * * * *